US010187027B2

(12) United States Patent
Rocca et al.

(10) Patent No.: US 10,187,027 B2
(45) Date of Patent: Jan. 22, 2019

(54) INTEGRATED CIRCUIT ARRANGEMENT FOR A MICROPHONE, MICROPHONE SYSTEM AND METHOD FOR ADJUSTING ONE OR MORE CIRCUIT PARAMETERS OF THE MICROPHONE SYSTEM

(71) Applicant: TDK Corporation, Tokyo (JP)

(72) Inventors: Gino Rocca, Copenhagen (DK); Tomasz Hanzlik, Szczecin (PL)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 15/548,371

(22) PCT Filed: Feb. 27, 2015

(86) PCT No.: PCT/EP2015/054162
§ 371 (c)(1),
(2) Date: Aug. 2, 2017

(87) PCT Pub. No.: WO2016/134788
PCT Pub. Date: Sep. 1, 2016

(65) Prior Publication Data
US 2018/0034431 A1    Feb. 1, 2018

(51) Int. Cl.
*H03G 3/30* (2006.01)
*H03F 1/30* (2006.01)
(Continued)

(52) U.S. Cl.
CPC ......... *H03G 3/3026* (2013.01); *H03F 1/0272* (2013.01); *H03F 1/26* (2013.01);
(Continued)

(58) Field of Classification Search
None
See application file for complete search history.

(56) References Cited

U.S. PATENT DOCUMENTS

| 7,224,226 B2 | 5/2007 | Kojima et al. |
| 2004/0085135 A1 | 5/2004 | Jaehne et al. |

(Continued)

FOREIGN PATENT DOCUMENTS

| EP | 2890155 A1 | 7/2015 |
| JP | 2001196877 A | 7/2001 |

(Continued)

OTHER PUBLICATIONS

Cuadras, A. et al., "Power-Noise Trade-Off in Signal Amplifiers," IEEE International Instrumentation and Measurement Technology Conference (I2MTC), May 13-16, 2012, 5 pages.

*Primary Examiner* — Paul Huber
(74) *Attorney, Agent, or Firm* — Slater Matsil, LLP

(57) ABSTRACT

An integrated circuit arrangement for a microphone, a microphone system and a method for adjusting circuit parameters of the microphone are disclosed. In an embodiment an integrated circuit includes an amplifier circuit with a first switchable network circuit for adjusting an amplifier current of the amplifier circuit, the first switchable network circuit comprising a plurality of switches (SW1, . . . , SWx) each coupled with a first control port of the first switchable network circuit and a control unit coupled with the first control port of the first switchable network circuit and configured to control a setting of the respective switches (SW1, . . . , SWx) of the first switchable network circuit.

12 Claims, 4 Drawing Sheets

(51) Int. Cl.
  *H03F 3/187*    (2006.01)
  *H04R 3/00*     (2006.01)
  *H04R 29/00*    (2006.01)
  *H03F 1/02*     (2006.01)
  *H03F 1/26*     (2006.01)

(52) U.S. Cl.
  CPC ............ *H03F 1/304* (2013.01); *H03F 3/187* (2013.01); *H04R 3/00* (2013.01); *H04R 29/004* (2013.01); *H03F 2200/03* (2013.01); *H03F 2200/15* (2013.01); *H03F 2200/24* (2013.01); *H03F 2200/411* (2013.01); *H03F 2200/511* (2013.01); *H03F 2200/519* (2013.01); *H03F 2200/525* (2013.01); *H04R 2201/003* (2013.01)

(56) References Cited

U.S. PATENT DOCUMENTS

| | | |
|---|---|---|
| 2009/0003629 A1 | 1/2009 | Shajaan et al. |
| 2011/0142261 A1 | 6/2011 | Josefsson |
| 2011/0316634 A1 | 12/2011 | Vasani et al. |
| 2013/0003995 A1 | 1/2013 | Poulsen |
| 2013/0051582 A1 | 2/2013 | Kropfitsch et al. |
| 2013/0271307 A1 | 10/2013 | Kropfitsch et al. |
| 2014/0064523 A1 | 3/2014 | Kropfitsch et al. |
| 2014/0077882 A1 | 3/2014 | Draxelmayr et al. |
| 2014/0257813 A1 | 9/2014 | Mortensen |
| 2014/0264652 A1 | 9/2014 | Cagdaser et al. |

FOREIGN PATENT DOCUMENTS

| | | |
|---|---|---|
| JP | 2006067166 A | 3/2006 |
| JP | 3154994 U | 11/2009 |

US 10,187,027 B2

INTEGRATED CIRCUIT ARRANGEMENT FOR A MICROPHONE, MICROPHONE SYSTEM AND METHOD FOR ADJUSTING ONE OR MORE CIRCUIT PARAMETERS OF THE MICROPHONE SYSTEM

This patent application is a national phase filing under section 371 of PCT/EP2015/054162, filed Feb. 27, 2015 which is incorporated herein by reference in its entirety.

TECHNICAL FIELD

The invention relates to an integrated circuit arrangement for a microphone, preferably a micro-electro-mechanical systems microphone (MEMS microphone), and a microphone system comprising the integrated circuit arrangement and the microphone. Furthermore, the invention relates to a method for adjusting one or more circuit parameters of the microphone system.

BACKGROUND

Microphones, preferably MEMS microphones, are used in a variety of consumer applications such as cellular telephones, telephones, hearing aids, digital audio recorders, personal computers and so forth. Integrating a microphone in an application system involves a number of system optimization and design trade-offs.

SUMMARY OF THE INVENTION

Embodiments provide an integrated circuit arrangement for a microphone, preferably a MEMS microphone, and a microphone system as well as a method for adjusting circuit parameters of the microphone system which allow a flexible adjustment of the circuit parameters of the microphone system, preferably after final assembly.

According to a first aspect, the invention is distinguished by an integrated circuit arrangement for a microphone comprising an amplifier circuit and a control unit. The amplifier circuit comprises a first switchable network circuit for adjusting an amplifier current of the amplifier circuit. The first switchable network circuit comprises a plurality of switches each coupled with a first control port of the first switchable network circuit. The control unit is coupled with the first control port of the first switchable network circuit and is configured to control a setting of the respective switches of the first switchable network circuit.

Advantageously, in this way it is possible, after final assembly, to increase the amplifier current to get a better signal-to-noise ratio (SNR) or to reduce the amplifier current, if SNR is not a critical parameter, while keeping the remaining parameters unchanged, for example, sensitivity. Thus, design trade-offs with respect to an integration of a microphone in a system can be optimized after final assembly on the part of a supplier or customer. The amplifier current of the integrated circuit arrangement can be flexibly adjusted. Thus, the number of variants of microphones and microphone systems for different applicants and/or customer requirements may be kept to a minimum. Because of the flexible adjustment after final assembly it is possible to make design trade-offs on an application level, in particular optimizing SNR and current at a higher system level. A specific microphone may then be used for various applications.

According to an embodiment of the first aspect, the amplifier circuit comprises a second switchable network circuit for adjusting an amplifier gain of the amplifier circuit. The second switchable network circuit comprises a plurality of switches each coupled with a second control port of the second switchable network circuit. The control unit is coupled with the second control port of the second switchable network circuit and is configured to control a setting of the respective switches of the second switchable network circuit. Advantageously such an arrangement makes it possible to optimize further design parameters of a microphone system, therefore providing a higher flexibility. Thus, the number of variants of microphones and microphone systems for different applicants and/or customer requirements may be further reduced.

According to a further embodiment of the first aspect, the first switchable network circuit comprises a first switchable resistor network and/or the second switchable network circuit comprises a second switchable resistor network. During a design phase multiple, and therefore sufficient, combinations of SNR and current can be made available. Also a range and a number of adjustment steps of the amplifier current and the gain, respectively, can be defined properly. The integration of the resistors makes a low-cost manufacturing of the integrated circuit possible. In particular, the amplifier current may be adjusted by the first switchable resistor network. The amplifier gain depends on a setting of the first and the second switchable resistor network. So, if the amplifier current is established in a first step, in a second step the amplifier gain may be set by means of the second switchable resistor network.

According to a further embodiment of the first aspect, the amplifier circuit comprises a transistor amplifier with a single transistor. The single transistor may comprise a distributed structure. A small input signal controls the single transistor, which outputs a bigger output signal due to its amplifying characteristic. With its simple structure, the transistor amplifier offers the possibility of easily adjusting different amplifier parameters.

According to a further embodiment of the first aspect, the amplifier circuit comprises a p-type enhancement-mode metal-oxide-semiconductor field-effect transistor (MOS-FET) transistor amplifier. The p-type MOS-FET has the advantage over a n-type MOS-FET of having, for the same area, a lower Flicker noise, thereby yielding to a better microphone SNR.

According to a further embodiment of the first aspect, the first switchable resistor network comprises a first port and a second port, wherein the first port is coupled with a preselected potential and the second port is coupled with a drain connection of the transistor. This allows for easy correspondence between a resistor value of the first switchable resistor network and the amplifier current.

According to a further embodiment of the first aspect, the second switchable resistor network comprises a first port and a second port, wherein the first port is coupled with a given supply voltage and the second port is coupled with a source connection of the transistor. This allows for easy correspondence between a resistor value of the second resistor network and the amplifier gain.

According to a further embodiment of the first aspect, the integrated circuit arrangement comprises a biasing circuit being coupled with the control unit. The biasing circuit is configured to provide a variable biasing voltage for the microphone, and the control unit is configured to determine a biasing control signal for controlling a voltage level of the biasing voltage. By varying the biasing voltage a sensitivity of the microphone, in particular of a MEMS microphone, can be changed, which results in changing the signal level at the input of the integrated circuit arrangement.

According to a further embodiment of the first aspect, the control unit is configured to determine, dependent on at least one captured and/or determined operational parameter of the integrated circuit arrangement, a first control signal for controlling the setting of the respective switches of the first switchable network circuit, wherein the first control signal is representative for a given amplifier current, and/or a second control signal for controlling the setting of the respective switches of the second switchable network circuit, wherein the second control signal depends on a desired amplifier gain and/or the biasing control signal being representative for a given voltage level.

Advantageously, in this way the control unit is able to control the state of the first and/or second resistor network and/or the biasing circuit dependent on application-specific parameters, for instance a supply voltage provided in a smart phone and/or microphone-specific parameters. In particular, the second control signal depends on the desired amplifier gain and the given amplifier current.

According to a further embodiment of the first aspect, the at least one operational parameter of the integrated circuit arrangement comprises a level of the supply voltage of the integrated circuit arrangement and/or a frequency of a clock signal of the biasing circuit. This allows for a simple adjustment of the amplifier current and/or amplifier gain.

According to a further embodiment of the first aspect, the control unit is configured to capture and/or determine the at least one operational parameter of the integrated circuit arrangement. With such an arrangement it is possible that the integrated circuit sets its preferred combination of SNR and current without any support from the outside.

According to a second aspect, the invention is distinguished by a microphone system comprising a microphone and an integrated circuit arrangement according to the first aspect, wherein an output of the microphone is coupled with an input of the integrated circuit arrangement.

Advantageous embodiments of the first aspect are also valid for the second aspect.

According to a third aspect, the invention is distinguished by a method for adjusting one or more circuit parameters of a microphone system, wherein the microphone system comprises an integrated circuit arrangement with an amplifier circuit comprising a first switchable network circuit for adjusting an amplifier current of the amplifier circuit. The method comprises the following steps: a) determining a signal-to-noise ratio of the microphone system, b) capturing a current consumption of the microphone system, c) determining and providing, dependent on the signal-to-noise ratio and the current consumption, a first control signal for controlling the setting of the respective switches of the first switchable network circuit, wherein the first control signal is representative for a given amplifier current,—repeating steps a) to c) until a given minimum signal-to-noise ratio has been reached.

Advantageous embodiments of the first and second aspects are also valid for the third aspect. In this way it is possible to trim the amplifier current until a minimum specified SNR is reached. The method steps described herein are not necessarily performed in the above-described order.

According to an embodiment of the third aspect, the amplifier circuit comprises a second switchable network circuit for adjusting an amplifier gain of the amplifier circuit, and the method further comprises the steps: Determining a sensitivity of the microphone system and determining and providing, dependent on the sensitivity, a second control signal for controlling the setting of the respective switches of the second switchable network circuit, wherein the second control signal depends on a desired amplifier gain.

In this way it is possible to trim the amplifier current until a minimum specified SNR has been reached and a target sensitivity can be adhered to. If the amplifier current is established in a first step, the desired amplifier gain may be set by means of the second switchable resistor network.

The method steps described herein are not necessarily performed in the above-described order. In particular, it may be appropriate to perform the gain adjustment first in combination with a first amplifier current adjustment.

BRIEF DESCRIPTION OF THE DRAWINGS

Exemplary embodiments of the invention are explained in the following with the aid of schematic drawings. These are as follows.

Elements of the same design and function that appear in different figures are identified by the same reference numerals.

DETAILED DESCRIPTION OF ILLUSTRATIVE EMBODIMENTS

Figure 1:
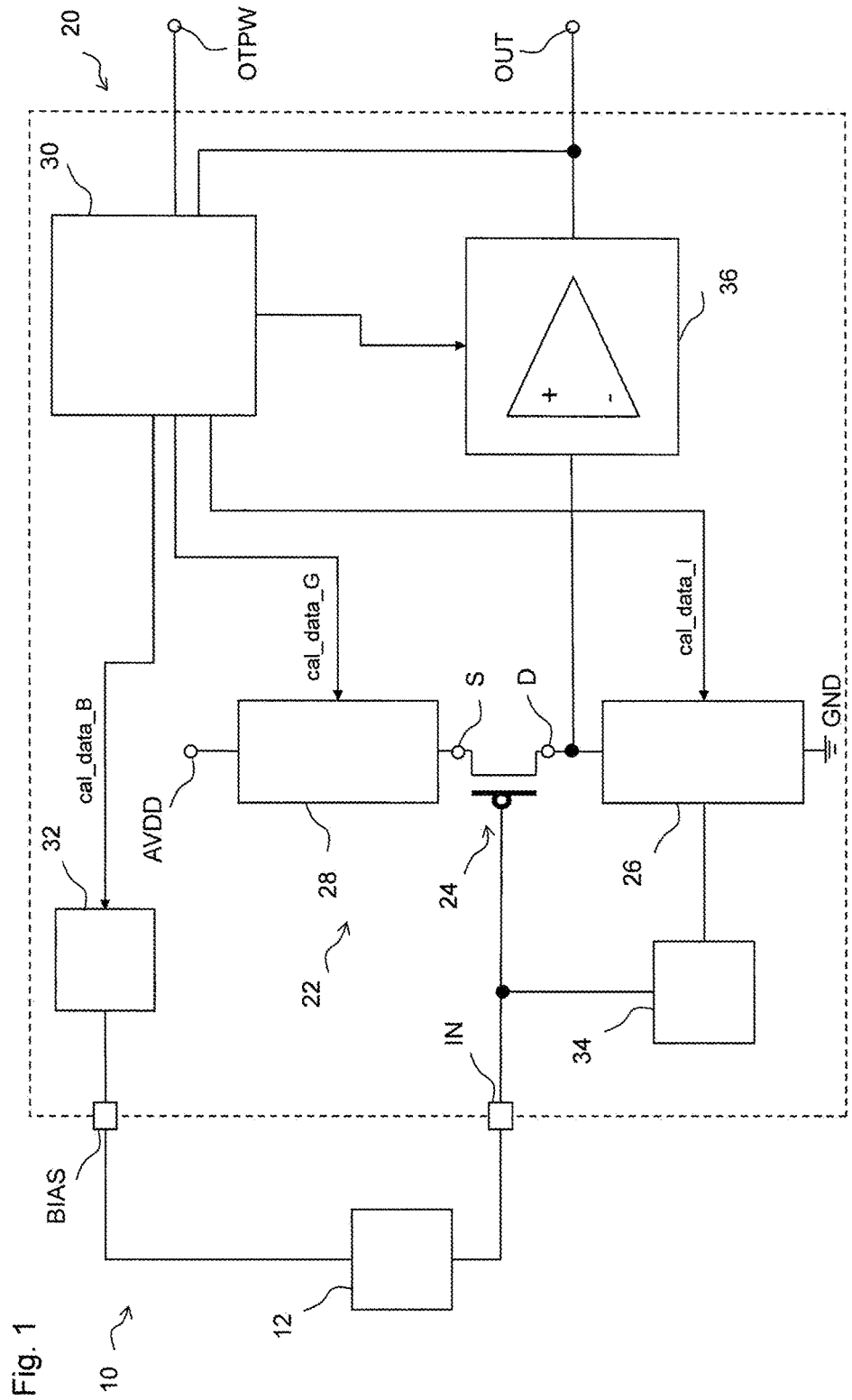
FIG. 1 is a block diagram exemplifying a microphone system.

FIG. 1 exemplifies a microphone system 10 comprising a microphone 12, preferably a micro-electro-mechanical systems microphone (MEMS microphone), and an integrated circuit arrangement 20.

The MEMS microphone is relevant to embodiments herein and may correspond, but is not limited, to a MEMS microphone. In fact, the invention may also be applied to other types of analog or digital microphones.

Preferably the integrated circuit arrangement 20 is configured as an Application Specific Integrated Circuit (ASIC). The integrated circuit arrangement 20 is configured to be coupled with the MEMS microphone.

The MEMS microphone is not necessarily included on the same chip as the integrated circuit arrangement 20. The MEMS microphone may be included on the chip or, for instance, on a separate die housed within the same package.

The integrated circuit arrangement 20 comprises an amplifier circuit 22. Preferably the amplifier circuit 22 is used as a pre-amplifier stage. The amplifier circuit 22 is configured to amplify an output signal of the microphone 12. For this purpose an output of the microphone 12 is coupled with an input IN of the integrated circuit arrangement 20.

The amplifier circuit 22 may comprise a transistor amplifier with a single transistor 24, for instance a common source circuit. The single transistor 24 may be a FET transistor. The amplifier circuit 22 may comprise a p-type enhancement-mode MOS-FET.

The amplifier circuit 22 comprises a first switchable network circuit 26 to adjust an amplifier current of the amplifier circuit 22. The first switchable network circuit 26 may be configured such that the amplifier current may be adjusted within a range from 35 µA to 65 µA in 5 µA steps.

Figure 2:
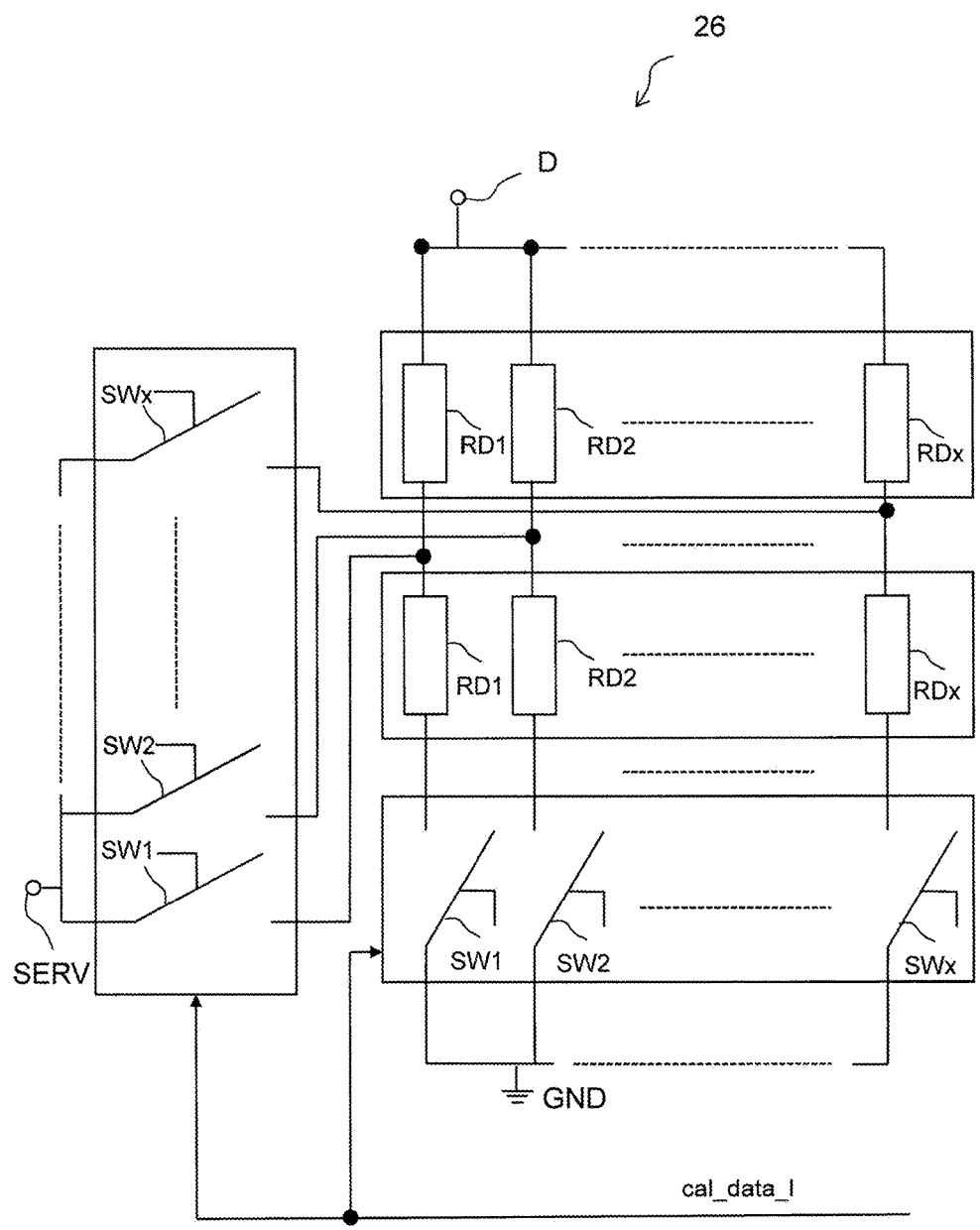
FIG. 2 is a block diagram of an exemplary embodiment of a first switchable network circuit.

FIG. 2 shows a block diagram of an exemplary embodiment of the first switchable network circuit 26. The first switchable network circuit 26 preferably comprises a first switchable resistor network.

The first switchable resistor network comprises, for instance, a resistor matrix with a first number of resistor rows and a second number of resistor columns, wherein the resistors RD1, . . . , RDx are coupled in a mesh-like manner. The first switchable resistor network comprises a plurality of switches arranged and configured to control a mesh configuration of the resistor matrix.

Each switch SW1, . . . , SWx comprises a switch pin configured to control the switch setting of the switch SW1, . . . , SWx. Each of the switch pins is coupled with a first control port of the first switchable network circuit 26.

For instance, the first switchable resistor network is coupled with a preselected potential GND, for instance a ground potential, and a drain connection D of the transistor 24. In this way, the first switchable resistor network represents a drain resistance of the common source circuit. By controlling a switch setting of the switches SW1, . . . , SWx of the first switchable resistor network a desired current, in particular a desired drain current, of the amplifier circuit 22 can be reached. As the setting of the first switchable resistor network also influences the amplifier gain a desired gain of the amplifier circuit 22 can also be reached by controlling the switch setting of the switches SW1, . . . , SWx of the first switchable resistor network.

As shown in FIG. 1, the integrated circuit arrangement 20 may comprise a biasing circuit 32 for the microphone 12. Preferably the biasing circuit 32 is configured to provide a variable biasing voltage for the microphone 12. For instance, the biasing circuit 32 is configured to provide the biasing voltage at a biasing pin BIAS of the microphone. The biasing circuit 32 may comprise a charge pump, for instance a Dickson charge pump.

As shown in FIG. 1, the amplifier circuit 22 may comprise a second switchable network circuit 28 to adjust an amplifier gain of the amplifier circuit 22. The second switchable network circuit 28 preferably comprises a second switchable resistor network.

The second switchable network circuit 28 may be configured such that the amplifier gain may be adjusted within a range from 9 dBs to 21 dBs in 0.4 dB steps.

Figure 3:
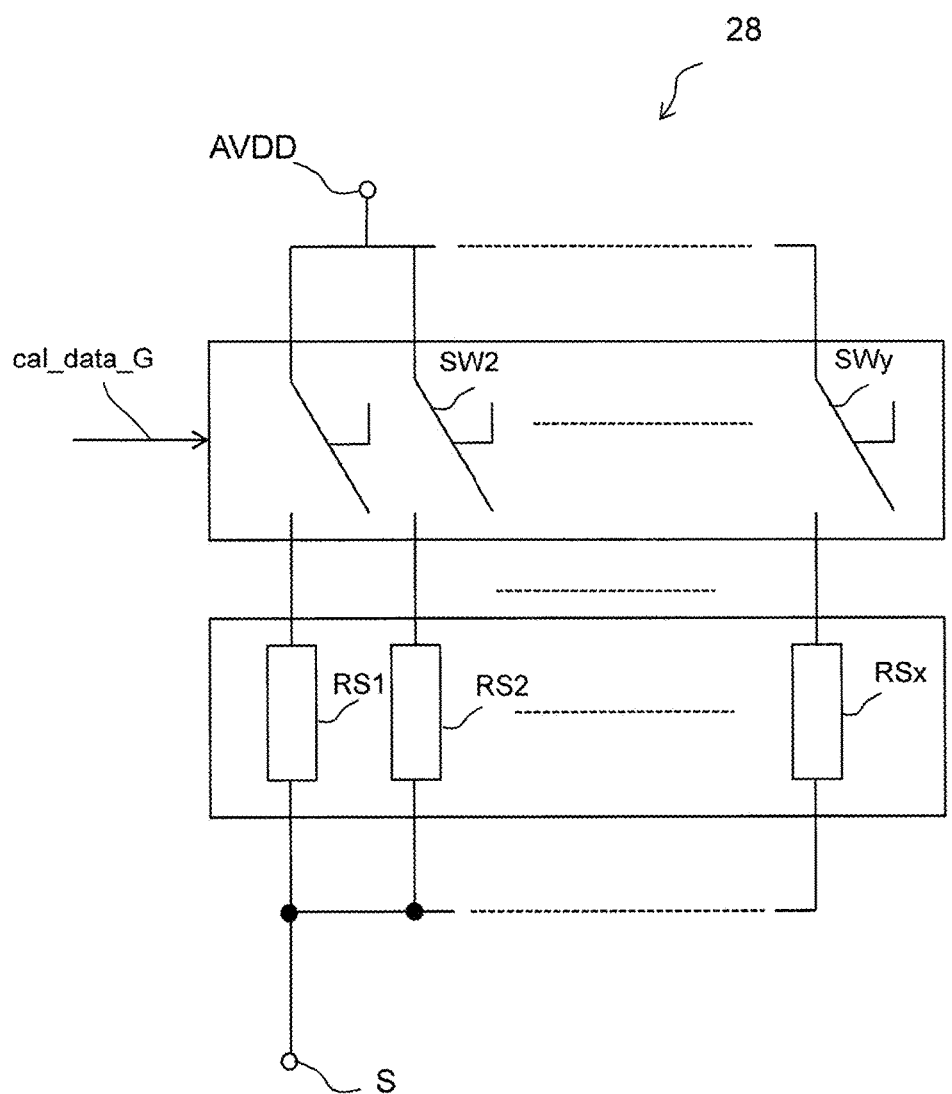
FIG. 3 is a block diagram of an exemplary embodiment of a second switchable network circuit.

FIG. 3 shows a block diagram of an exemplary embodiment of the second switchable network circuit 28.

The second switchable resistor network comprises, for instance, a second resistor array and a second switch array. The second resistor array comprises a plurality of resistors RS1, . . . , RSx, wherein the resistors RS1, . . . , RSx are arranged in parallel and each resistor RS1, . . . , RSx is coupled to a respective switch SW1, . . . , SWy of the first switch array. Each switch SW1, . . . , SWy comprises a switch pin configured to control the switch setting of the switch SW1, . . . , SWy. Each of the switch pins is coupled with a second control port of the second switchable network circuit 28. Furthermore, each switch SW1, . . . , SWy comprises a first pin coupled with a given supply voltage AVDD and a second pin coupled with a first pin of the corresponding resistor RS1, . . . , RSy of the second resistor array. A second pin of the respective resistors is coupled to a source connection S of the transistor 24.

In this way, the second switchable resistor network represents a source resistance of the common source circuit. By controlling a switch setting of the switches SW1, . . . , SWy of the second switchable resistor network a desired amplifier gain can be reached. In particular, the amplifier current may be adjusted by the first switchable resistor network. The amplifier gain may be dependent on a setting of the first and the second switchable resistor network. So, if the amplifier current is established in a first step, the amplifier gain may be set by means of the second switchable resistor network.

As shown in FIG. 1, the integrated circuit arrangement 20 comprises a control unit 30 configured to control the switch settings of the first and/or the second switchable network circuits 26, 28.

The biasing circuit 32 may be coupled with the control unit 30 for controlling a voltage level of the biasing voltage. The biasing circuit 32 may be configured to adjust the biasing voltage dependent on a biasing control signal cal_data_B of the control unit 30.

The control unit 30 may comprise a non-volatile memory, for example, a One Time Programmable memory (OTP memory) for storing one or more preferred current and/or gain settings.

Alternatively or additionally, the control unit 30 may comprise at least one look-up table which maps a captured and/or determined operational parameter of the microphone system 10, for instance a supply voltage AVDD of the integrated circuit arrangement 20 and/or a frequency of a clock signal of a biasing circuit 32, into a first control signal cal_data_I and/or into a second control signal cal_data_G and/or into the biasing control signal cal_data_B.

The control unit 30 may be configured to determine, dependent on at least one captured and/or determined operational parameter of the integrated circuit arrangement 20 and/or the microphone system 10, the first control signal cal_data_I for controlling the setting of the respective switches SW1, . . . , SWx of the first switchable network circuit 26, wherein the first control signal cal_data_I is representative for a given amplifier current, and/or the second control signal cal_data_G for controlling the setting of the respective switches SW1, . . . , SWx of the second switchable network circuit 28, wherein the second control signal depends on a desired amplifier gain, and/or the biasing control signal cal_data_B being representative for a given voltage level.

Optionally the control unit 30 may be configured to capture and/or determine the at least one operational parameter of the integrated circuit arrangement 20 and/or the microphone system 10.

Additionally or alternatively the control unit 30 may comprise a digital processor or custom digital logic to determine the first control signal cal_data_I and/or the second control signal cal_data_G and/or the biasing control signal cal_data_B dependent on the at least one captured and/or determined operational parameter of the microphone system 10.

The control unit 30 may be configured to optimize SNR and/or current consumption. Additionally the control unit 30 may be configured to program the non-volatile memory during final testing, for instance by means of one extra pad OTPW.

Optionally, the integrated circuit arrangement 20 comprises a DC-servo circuit 34. The DC-servo circuit 34 is configured to improve a voltage settling time of the input voltage of the amplifier circuit 22. DC-servo circuit 34 may be coupled with the second switchable network circuit 28.

The integrated circuit arrangement 20 may comprise a main amplifier 36 for amplifying an output signal of the amplifier circuit 22 which may act as a pre-amplifier. The main amplifier 36 is configured to provide a main output signal of the microphone system 10, for instance, on an output OUT of the integrated circuit arrangement 20. The main amplifier 36 may be coupled with the control unit 30 for providing the main output signal to the control unit 30.

The integrated circuit may comprise further circuit elements, like an automatic voltage generator and/or a clock generator.

The SNR of the microphone system 10 depends on the SNR of the integrated circuit arrangement 20 and in particular on the SNR of the pre-amplifier. The SNR of the integrated circuit arrangement 20 is also related to a current flowing into the integrated circuit arrangement 20, which can be a significant percentage of the current consumption of the microphone system 10. In particular SNR increases with current depending on a specific circuit and system implementation.

Figure 4:
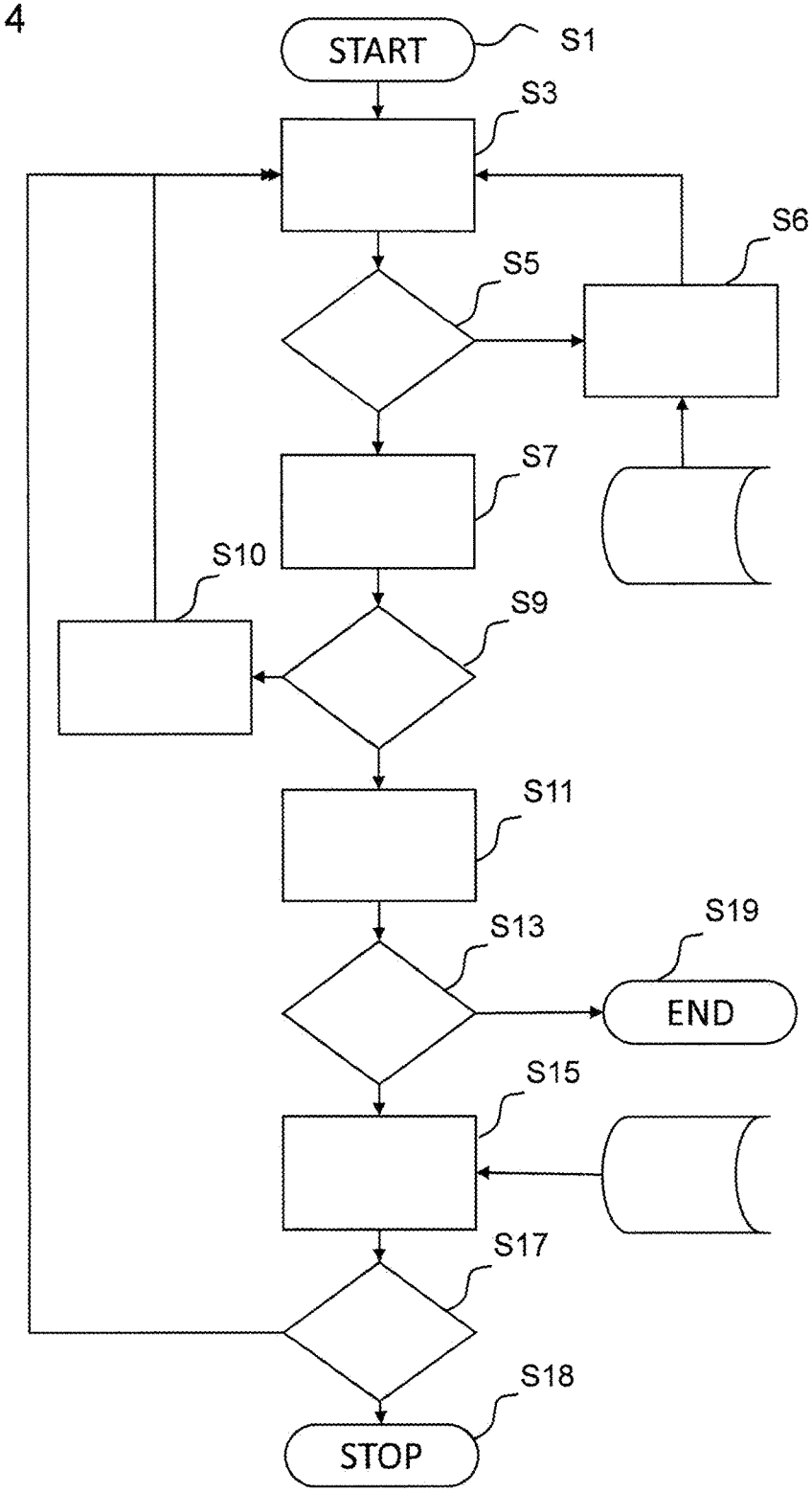
FIG. 4 is a flow chart of a program for adjusting one or more circuit parameters of a microphone system.

FIG. 4 shows a flow chart of a program for adjusting one or more circuit parameters of the microphone system 10. The program can, for example, be executed by the control unit 30 or partly by the control unit 30 or by another calibration device.

By this program, for an example a microphone system 10 which has an SNR of 60 dB and consumes 50 µA can be properly reconfigured on the part of a supplier or customer so that its SNR is 62 dB at the expense of additionally 50 µA current consumption. By proper trimming of the current, a very tight distribution of current, sensitivity or SNR can also be achieved, if this is required by the customer.

The program starts in a step S1. In an optional step S3 a sensitivity of the microphone system 10 is determined. The second control signal cal_data_G for controlling the setting of the respective switches SW1, . . . , SWy of the second switchable network circuit 28 is determined dependent on the sensitivity. In particular, in a step S5 it is checked if a given target sensitivity of the microphone system 10 has been reached or not. If the sensitivity is lower than the given target sensitivity, the amplifier gain is increased in a step S6 by providing the second control signal cal_data_G which is, for instance, determined dependent on a desired amplifier current and a given amplifier gain which corresponds to the target sensitivity. In the event that the sensitivity is higher than the given target sensitivity, the amplifier gain is decreased in the step S6. The target sensitivity and a corresponding amplifier gain may be stored in the look-up table of the control unit 30.

If the target sensitivity has been reached, in a step S7 a current consumption of the microphone system 10 is captured. The current consumption may alternatively be captured in step S3. In a step S9 it is checked if the current consumption of the microphone system 10 is lower than a given maximum current consumption. If the captured current consumption exceeds the maximum current consumption, the first control signal cal_data_I for controlling the setting of the respective switches of the first switchable network circuit 26 is determined in a step S10 for decreasing the current consumption, and the program may be continued in step S3. In particular, in step S10 the first control signal cal_data_I is provided which is representative for a given decreased amplifier current.

If the current consumption of the microphone system 10 is lower than the given maximum current consumption, in a step Su a signal-to-noise ratio (SNR) of the microphone system 10 is determined. In a step S13 it is checked if the SNR of the microphone system 10 is higher than a given minimum SNR.

If the SNR is higher than the given minimum SNR, the program ends in step S19. If the SNR is lower than the given minimum SNR, in a step S15 the first control signal cal_data_I for controlling the setting of the respective switches SW1, . . . , SWx of the first switchable network circuit 26 is determined for increasing the current consumption.

In an optional step S17 it is checked if the newly determined current consumption is higher than a critical value. If the newly determined current consumption is higher than the critical value, the program stops in a step S18 and an error report is provided stating that the microphone system 10 is outside of an SNR specification.

If the newly determined current consumption is lower than the critical value, the program is continued in step S3.

Some customers may require that the distribution of the SNR is very tight and/or the current consumption of the microphone system 10 does not overcome the critical value. In these cases such requirements would typically have an impact on a microphone yield.

By using a proper calibration process, like the program for the adjusting one or more circuit parameters of the microphone system 10, the microphone yield may be improved and the distribution for sensitivity and SNR may be tightened or the microphone yield may be improved and the distribution for current may be tightened.

The invention claimed is:

1. An integrated circuit arrangement for a microphone comprising:
    an amplifier circuit with a first switchable network circuit for adjusting an amplifier current of the amplifier circuit, the first switchable network circuit comprising a plurality of switches (SW1, . . . , SWx) each coupled with a first control port of the first switchable network circuit and a second switchable network circuit for adjusting an amplifier gain of the amplifier circuit, the second switchable network circuit comprising a plurality of switches (SW1, . . . , SWy) each coupled with a second control port of the second switchable network circuit; and
    a control unit coupled with the first control port of the first switchable network circuit and coupled with the second control port of the second switchable network circuit,
    wherein the control unit is configured to control a setting of the respective switches (SW1, . . . , SWx) of the first switchable network circuit and control a setting of the respective switches (SW1, . . . , SWy) of the second switchable network circuit,
    wherein the amplifier circuit is a single transistor amplifier,
    wherein the first switchable network circuit is configured to adjust the amplifier current of the transistor amplifier, and
    wherein the second switchable network circuit is configured to adjust the amplifier gain of the single transistor amplifier.

2. The integrated circuit arrangement according to claim 1, wherein the first switchable network circuit comprises a first switchable resistor network and/or the second switchable network circuit comprises a second switchable resistor network.

3. The integrated circuit arrangement according to claim 1, wherein the amplifier circuit comprising a p-type enhancement-mode metal-oxide-semiconductor field-effect transistor (MOS-FET) transistor amplifier.

4. The integrated circuit arrangement according to claim 2, wherein the first switchable resistor network comprising a first port and a second port, and wherein the first port is coupled with a preselected potential and the second port is coupled with a drain connection of a transistor.

5. The integrated circuit arrangement according to claim 2, wherein the second switchable resistor network comprising a first port and a second port, and wherein the first port is coupled with a given supply voltage and the second port is coupled with a source connection of a transistor.

6. The integrated circuit arrangement according to claim 1, further comprising a biasing circuit being coupled with the control unit, the biasing circuit being configured to provide a variable biasing voltage for the microphone and the control unit being configured to determine a biasing control signal for controlling a voltage level of the biasing voltage.

7. The integrated circuit arrangement according to claim 1, wherein the control unit is configured to determine, dependent on at least one captured and/or determined operational parameter of the integrated circuit arrangement,
- a first control signal for controlling the setting of the respective switches (SW1, . . . , SWx) of the first switchable network circuit, wherein the first control signal is representative for a given amplifier current, and/or
- a second control signal for controlling the setting of the respective switches (SW1, . . . , SWy) of the second switchable network circuit, wherein the second control signal depends on a desired amplifier gain, and/or
- a biasing control signal being representative for a given voltage level.

8. The integrated circuit arrangement according to claim 7, wherein the at least one operational parameter of the integrated circuit arrangement comprises a level of a supply voltage of the integrated circuit arrangement and/or a frequency of a clock signal of a biasing circuit.

9. The integrated circuit arrangement according to claim 7, wherein the control unit is configured to capture and/or determine the at least one operational parameter of the integrated circuit arrangement.

10. A microphone system comprising:
a microphone; and
an integrated circuit arrangement according to claim 1, wherein an output of the microphone is coupled to an input of the integrated circuit arrangement.

11. A method for adjusting one or more circuit parameters of a microphone system, wherein the microphone system comprises an integrated circuit arrangement with an amplifier circuit comprising a first switchable network circuit for adjusting an amplifier current of the amplifier circuit, the method comprising:
A) determining a signal-to-noise ratio of the microphone system;
B) capturing a current consumption of the microphone system;
C) determining and providing, dependent on the signal-to-noise ratio and the current consumption, a first control signal for controlling a setting of respective switches (SW1, . . . , SWx) of the first switchable network circuit, wherein the first control signal is representative for a given amplifier current; and
repeating steps A) to B) until a given minimum signal-to-noise ratio is reached.

12. A method according to claim 11, wherein the amplifier circuit comprises a second switchable network circuit for adjusting an amplifier gain of the amplifier circuit, the method further comprising:
determining a sensitivity of the microphone system,
determining and providing, dependent on the sensitivity, a second control signal for controlling a setting of the respective switches (SW1, . . . , SWy) of the second switchable network circuit, wherein the second control signal depends on a desired amplifier gain.

* * * * *